(12) United States Patent
Shaw et al.

(10) Patent No.: US 11,831,211 B2
(45) Date of Patent: Nov. 28, 2023

(54) STATOR AND ROTOR DESIGN FOR PERIODIC TORQUE REQUIREMENTS

(71) Applicant: E-Circuit Motors, Inc., Needham Heights, MA (US)

(72) Inventors: Steven Robert Shaw, Bozeman, MT (US); George Harder Milheim, Bozeman, MT (US)

(73) Assignee: E-Circuit Motors, Inc., Needham Heights, MA (US)

( * ) Notice: Subject to any disclaimer, the term of this patent is extended or adjusted under 35 U.S.C. 154(b) by 0 days.

(21) Appl. No.: 17/980,925

(22) Filed: Nov. 4, 2022

(65) Prior Publication Data

US 2023/0050229 A1     Feb. 16, 2023

Related U.S. Application Data (62) Division of application No. 16/665,763, filed on Oct. 28, 2019, now Pat. No. 11,527,933.
(Continued)

(51) Int. Cl.
*H02K 3/26*     (2006.01)
*H02K 1/18*     (2006.01)
(Continued)

(52) U.S. Cl.
CPC .............. *H02K 3/26* (2013.01); *H02K 1/182* (2013.01); *H02K 1/27* (2013.01); *H02K 3/50* (2013.01); *H02K 21/24* (2013.01); *H05K 1/0298* (2013.01); *H05K 1/165* (2013.01); *H05K 2201/09227* (2013.01)

(58) Field of Classification Search
CPC combination set(s) only.
See application file for complete search history.

(56) References Cited

U.S. PATENT DOCUMENTS 2,970,238 A   1/1961   Swiggett
3,096,455 A   7/1963   Hahn
(Continued)

FOREIGN PATENT DOCUMENTS

CN   202856473 U   4/2013
CN   103138442 A   6/2013
(Continued)

OTHER PUBLICATIONS

Taiwan Search Report dated May 18, 2023 for Taiwanese Application No. 108139588.
(Continued)

*Primary Examiner* — Thomas Truong
(74) *Attorney, Agent, or Firm* — PIERCE ATWOOD LLP (57) ABSTRACT

Disclosed is a motor or generator comprises a rotor and a stator, wherein the rotor has an axis of rotation and is configured to generate first magnetic flux parallel to the axis of rotation, the stator is configured to generate second magnetic flux parallel to the axis of rotation, and at least one of the rotor or the stator is configured to generate a magnetic flux profile that is non-uniformly distributed about the axis of rotation. Also disclosed is a method that involves arranging one or more magnetic flux producing windings of a stator non-uniformly about an axis of rotation of a rotor of an axial flux motor or generator.

17 Claims, 9 Drawing Sheets

Related U.S. Application Data (60) Provisional application No. 62/754,051, filed on Nov. 1, 2018.

(51) Int. Cl.
   *H05K 1/02*      (2006.01)
   *H02K 1/27*      (2022.01)
   *H02K 21/24*     (2006.01)
   *H05K 1/16*      (2006.01)
   *H02K 3/50*      (2006.01)

(56) References Cited

U.S. PATENT DOCUMENTS

| | | |
|---|---|---|
| 3,944,857 A | 3/1976 | Faulhaber |
| 4,115,915 A | 9/1978 | Godfrey |
| 4,658,162 A | 4/1987 | Koyama et al. |
| 4,677,332 A | 6/1987 | Heyraud |
| 4,733,115 A | 3/1988 | Barone et al. |
| 4,804,574 A | 2/1989 | Osawa et al. |
| 5,099,162 A | 3/1992 | Sawada |
| 5,126,613 A | 6/1992 | Choi |
| 5,332,460 A | 7/1994 | Hosoya |
| 5,592,037 A | 1/1997 | Sickafus |
| 5,616,977 A | 4/1997 | Hill |
| 5,644,183 A | 7/1997 | Van Loenen et al. |
| 5,710,476 A | 1/1998 | Ampela |
| 5,773,905 A | 6/1998 | Hill |
| 5,801,473 A | 9/1998 | Helwig |
| 5,952,742 A | 9/1999 | Stoiber et al. |
| 6,005,320 A * | 12/1999 | Kim ............... H02K 29/08 310/68 B |
| 6,628,038 B1 | 9/2003 | Shikayama et al. |
| 7,109,625 B1 | 9/2006 | Jore et al. |
| 7,112,910 B2 | 9/2006 | Lopatinsky et al. |
| 7,301,428 B2 | 11/2007 | Suzuki et al. |
| 7,415,756 B2 | 8/2008 | Ishida et al. |
| 7,523,540 B2 | 4/2009 | Morel |
| 7,582,999 B2 | 9/2009 | Atkinson |
| 7,750,522 B2 | 7/2010 | Gizaw et al. |
| 7,812,697 B2 | 10/2010 | Fullerton et al. |
| 7,882,613 B2 | 2/2011 | Barthelmie et al. |
| 7,888,904 B2 | 2/2011 | Mulareik |
| 8,058,762 B2 | 11/2011 | Asano |
| 8,225,497 B2 | 7/2012 | Johnson et al. |
| 8,339,019 B1 | 12/2012 | Oyague |
| 8,362,731 B2 | 1/2013 | Smith et al. |
| 8,397,369 B2 | 3/2013 | Smith et al. |
| 8,400,038 B2 | 3/2013 | Smith et al. |
| 8,558,425 B2 | 10/2013 | Stahlhut et al. |
| 8,598,761 B2 | 12/2013 | Angford et al. |
| 8,692,637 B2 | 4/2014 | Richards et al. |
| 3,736,133 A1 | 5/2014 | Smith et al. |
| 8,716,913 B2 | 5/2014 | Kvam et al. |
| 8,723,052 B1 | 5/2014 | Sullivan et al. |
| 8,723,402 B2 | 5/2014 | Oyague |
| 8,736,133 B1 | 5/2014 | Smith et al. |
| 8,785,784 B1 | 7/2014 | Duford et al. |
| 8,823,241 B2 | 9/2014 | Jore et al. |
| 8,941,961 B2 | 1/2015 | Banerjee et al. |
| 9,013,257 B2 | 4/2015 | Steingroever |
| 9,030,071 B2 | 5/2015 | Bradley et al. |
| 9,154,024 B2 | 10/2015 | Jore et al. |
| 9,269,483 B2 | 2/2016 | Smith et al. |
| 9,479,038 B2 | 10/2016 | Smith et al. |
| 9,531,236 B2 | 12/2016 | Filatov |
| 9,673,684 B2 | 6/2017 | Shaw |
| 9,762,099 B2 | 9/2017 | Jore et al. |
| 9,859,763 B2 | 1/2018 | Shaw |
| 10,135,310 B2 | 11/2018 | Schuler et al. |
| 10,170,953 B2 | 1/2019 | Shaw |
| 10,186,922 B2 | 1/2019 | Schuler et al. |
| 10,211,694 B1 | 2/2019 | Shaw |
| 10,770,940 B2 * | 9/2020 | Thiele ............... H02K 1/182 |
| 10,819,174 B2 | 10/2020 | Schuler et al. |
| 10,951,080 B2 | 3/2021 | Mikail et al. |
| 2001/0030479 A1 | 10/2001 | Mohler |
| 2005/0067905 A1 | 3/2005 | Maney et al. |
| 2005/0194855 A1 | 9/2005 | Hasebe et al. |
| 2006/0055265 A1 | 3/2006 | Zalusky |
| 2006/0125342 A1 | 6/2006 | Mossner et al. |
| 2006/0202584 A1 | 9/2006 | Jore et al. |
| 2007/0247014 A1 | 10/2007 | Schach et al. |
| 2008/0067874 A1 | 3/2008 | Tseng |
| 2008/0100166 A1 | 5/2008 | Stahlhut et al. |
| 2009/0021333 A1 | 1/2009 | Fiedler |
| 2009/0072651 A1 | 3/2009 | Yan et al. |
| 2010/0000112 A1 | 1/2010 | Carow et al. |
| 2010/0123372 A1 | 5/2010 | Huang et al. |
| 2011/0024146 A1 | 2/2011 | Katou et al. |
| 2011/0241460 A1 | 10/2011 | Mebarki et al. |
| 2011/0273048 A1 | 11/2011 | Jore et al. |
| 2012/0033236 A1 | 2/2012 | Tsugimura |
| 2012/0041062 A1 | 2/2012 | Zhou et al. |
| 2012/0217831 A1 | 8/2012 | Jore et al. |
| 2012/0262019 A1 | 10/2012 | Smith et al. |
| 2012/0262020 A1 | 10/2012 | Smith et al. |
| 2013/0049500 A1 | 2/2013 | Shan et al. |
| 2013/0052491 A1 | 2/2013 | Bull et al. |
| 2013/0053942 A1 | 2/2013 | Kamel et al. |
| 2013/0072604 A1 | 3/2013 | Bowen, III et al. |
| 2013/0076192 A1 | 3/2013 | Tanimoto |
| 2013/0119802 A1 | 5/2013 | Smith et al. |
| 2013/0214631 A1 | 8/2013 | Smith et al. |
| 2013/0234566 A1 | 9/2013 | Huang et al. |
| 2013/0342054 A1 | 12/2013 | Long et al. |
| 2014/0021968 A1 | 1/2014 | Lee |
| 2014/0021969 A1 | 1/2014 | Tseng et al. |
| 2014/0021972 A1 | 1/2014 | Barabi et al. |
| 2014/0028149 A1 | 1/2014 | Oyague |
| 2014/0042868 A1 | 2/2014 | Sullivan et al. |
| 2014/0152136 A1 | 6/2014 | Duford et al. |
| 2014/0175922 A1 | 6/2014 | Jore et al. |
| 2014/0201291 A1 | 7/2014 | Russell |
| 2014/0262499 A1 | 9/2014 | Smith et al. |
| 2014/0268460 A1 | 9/2014 | Banerjee et al. |
| 2014/0368079 A1 | 12/2014 | Wong et al. |
| 2015/0084446 A1 | 3/2015 | Atar |
| 2015/0188375 A1 | 7/2015 | Sullivan et al. |
| 2015/0188391 A1 | 7/2015 | Carron et al. |
| 2015/0244219 A1 | 8/2015 | Woolmer |
| 2015/0311756 A1 | 10/2015 | Sullivan |
| 2015/0318751 A1 | 11/2015 | Smith et al. |
| 2015/0349609 A1 | 12/2015 | Tremelling et al. |
| 2016/0247616 A1 | 8/2016 | Smith et al. |
| 2016/0285327 A1 | 9/2016 | Sasaki et al. |
| 2016/0372995 A1 | 12/2016 | Smith et al. |
| 2017/0040878 A1 | 2/2017 | Smith et al. |
| 2017/0098973 A1 | 4/2017 | Shaw |
| 2017/0098982 A1 | 4/2017 | Shaw |
| 2018/0123412 A1 | 5/2018 | Karplus et al. |
| 2018/0198338 A1 | 7/2018 | Schuler et al. |
| 2020/0044524 A1 | 2/2020 | van Ginkel |
| 2021/0143691 A1 | 5/2021 | Lee et al. |
| 2021/0203213 A1 | 7/2021 | Jore et al. |

FOREIGN PATENT DOCUMENTS

| | | |
|---|---|---|
| CN | 104426263 A | 3/2015 |
| CN | 104600950 A | 5/2015 |
| CN | 104659996 A | 5/2015 |
| CN | 105871089 A | 8/2016 |
| CN | 106130291 A | 11/2016 |
| DE | 102010062271 A1 | 6/2012 |
| DE | 102019131198 A1 | 12/2020 |
| EP | 0563852 A1 | 10/1993 |
| EP | 1086523 A2 | 3/2001 |
| EP | 2696481 A2 | 2/2014 |
| EP | 2882079 A2 | 6/2015 |
| FR | 2262880 A1 | 9/1975 |
| GB | 2030790 A | 4/1980 |
| GB | 2485185 A | 5/2012 |
| JP | 58036145 A | 9/1984 |
| JP | 59213287 A | 12/1984 |

(56) References Cited

FOREIGN PATENT DOCUMENTS

| JP | 2008-259399 A | 10/2008 |
|---|---|---|
| TW | 201722035 A | 6/2017 |
| WO | 2004/015843 A1 | 2/2004 |
| WO | 2004/073365 A2 | 8/2004 |
| WO | 2009/068079 A1 | 6/2009 |

OTHER PUBLICATIONS

First Office Action dated Aug. 28, 2019 in Chinese Patent Application No. 201680057559.5.
First Office Action dated Sep. 29, 2019 in Chinese Patent Application No. 201680057552.3.
International Preliminary Report on Patentability dated Apr. 3, 2018 for International Application No. PCT/US2016/054704.
International Preliminary Report on Patentability dated Apr. 3, 2018 for International Application No. PCT/US2016/054794.
International Preliminary Report on Patentability dated Dec. 19, 2019 for International Application No. PCT/US2018/034569.
International Preliminary Report on Patentability dated Jan. 23, 2020 for International Application No. PCT/US2018/039500.
International Search Report and Written Opinion dated Aug. 30, 2018 for International Application No. PCT/US2018/034569.
International Search Report and Written Opinion dated Jan. 20, 2017 for International Application No. PCT/US2016/054704.
International Search Report and Written Opinion dated Jan. 4, 2017 for International Application No. PCT/US2016/054794.
International Search Report and Written Opinion dated Sep. 20, 2018 for International Application No. PCT/US2018/039500.
Office Action and Search Report dated Feb. 7, 2020 in Taiwanese Patent Application No. 105131805.
Office Action and Search Report dated Feb. 7, 2020 in Taiwanese Patent Application No. 105131938.
Office Action dated Sep. 29, 2016 for U.S. Appl. No. 15/199,527.
Second Office Action dated Jan. 10, 2020 in Chinese Patent Application No. 201680057559.5.
International Search Report and Written Opinion dated Jun. 2, 2020 for International Patent Application No. PCT/US2019/058716.
Office Action dated Dec. 29, 2022 for Indian Patent Application No. 202117018888.
EPO Examination Report dated Jan. 16, 2023 for European Patent Application No. 19805848.9.

* cited by examiner

STATOR AND ROTOR DESIGN FOR PERIODIC TORQUE REQUIREMENTS

CROSS-REFERENCE TO RELATED APPLICATIONS

This application is a divisional of and claims the benefit under 35 U.S.C. § 120 and 35 U.S.C. § 121 to U.S. patent application Ser. No. 16/665,763, entitled STATOR AND ROTOR DESIGN FOR PERIODIC TORQUE REQUIREMENTS, filed Oct. 28, 2019, which claims the benefit under 35 U.S.C. § 119(e) of U.S. Provisional Application Ser. No. 62/754,051, entitled PLANAR STATOR AND ROTOR DESIGN FOR PERIODIC TORQUE REQUIREMENTS, filed Nov. 1, 2018. The contents of each of the foregoing applications, publications, and patents are hereby incorporated herein, by reference, in their entireties, for all purposes.

BACKGROUND

Permanent magnet axial flux motors and generators described by several patents, including U.S. Pat. No. 7,109,625 ("the '625 patent"), feature a generally planar printed circuit board stator (PCS) interposed between magnets featuring alternating north-south poles. These printed circuit board stators, when supported to the fixed frame from the outside edge of the stator, have a hole through which the shaft linking the rotors passes. An alternate embodiment is to interchange roles of the inner and outer radius, resulting in a situation where the inner radius of the stator is supported, and the rotor envelopes the stator. The shaft is effectively moved to the outer radius in this configuration, sometimes called an "out-runner."

BRIEF DESCRIPTION OF THE DRAWINGS

Objects, aspects, features, and advantages of embodiments disclosed herein will become more fully apparent from the following detailed description, the appended claims, and the accompanying figures in which like reference numerals identify similar or identical elements. Reference numerals that are introduced in the specification in association with a figure may be repeated in one or more subsequent figures without additional description in the specification in order to provide context for other features, and not every element may be labeled in every figure. The drawings are not necessarily to scale, emphasis instead being placed upon illustrating embodiments, principles and concepts. The drawings are not intended to limit the scope of the claims included herewith.

SUMMARY

This Summary is provided to introduce a selection of concepts in a simplified form that are further described below in the Detailed Description. This Summary is not intended to identify key features or essential features, nor is it intended to limit the scope of the claims included herewith.

In some of the disclosed embodiments, a motor or generator comprises a rotor and a stator, wherein the rotor has an axis of rotation and is configured to generate first magnetic flux parallel to the axis of rotation, the stator is configured to generate second magnetic flux parallel to the axis of rotation, and at least one of the rotor or the stator is configured to generate a magnetic flux profile that is non-uniformly distributed about the axis of rotation.

In other disclosed embodiments, a method involves arranging one or more magnetic flux producing windings of a stator non-uniformly about an axis of rotation of a rotor of an axial flux motor or generator.

In yet other disclosed embodiments, a rotor for use in a motor or generator comprises a support structure and one or more magnet segments that are supported by the support structure and that generate first magnetic flux parallel to an axis of rotation about which the support structure rotates when assembled with a stator that generates second magnetic flux parallel to the axis of rotation, wherein the one or more magnet segments are configured and arranged to generate a magnetic flux profile that is non-uniformly distributed about the axis of rotation.

DETAILED DESCRIPTION

In existing axial flux motors or generators, such as those disclosed in U.S. Pat. Nos. 7,109,625; 9,673,688; 9,800,109; 9,673,684; and 10,170,953, as well as U.S. Patent Application Publication No. 2018-0351441 A1 ("the '441 Publication"), the entire contents of each of which are incorporated herein by reference, the magnetic flux generating components of the stator, whether comprised of a single continuous printed circuit board or multiple printed circuit board segments, are arranged such that, at any given time when the windings of the stator are energized with current, the locations of peak magnetic flux generated by the stator are distributed uniformly with respect to the angle about the rotor's axis of rotation. Similarly, in such machines, the magnetic flux generating components of the rotor, whether comprised of a ring magnet or individual magnets disposed in pockets, are also arranged such that, at any given point in time, the locations of peak magnetic flux generated by the rotor are likewise distributed uniformly with respect to angle about the rotor's axis of rotation. Accordingly, in all such machines, at any given time the machine is in operation, the locations of peak magnetic flux generated by each of the rotor and the stator are uniformly distributed as a function of angle about the machine's axis of rotation. In other words, for each of the rotor and the stator in such machines, the same angle separates each location of peak magnetic flux from the next adjacent location of peak magnetic flux about the axis of rotation so that that the magnetic flux profile of each of the rotor and the stator are uniformly distributed about the axis of rotation.

Disclosed herein are alternate designs, with advantages in cost relative to conventional designs for certain loads and machine configurations, in which the stator and/or the rotor may instead be configured to have a magnetic flux profile that is non-uniformly distributed about the rotor's axis of rotation. In some embodiments, for example, a stator can be configured so that it describes a fraction an arc surrounding the principle axis of the machine. If such a stator segment can be located, due to the integration of the machine with the attached load, at a large radius compared to a stator of equal area distributed uniformly about the same axis, the torque produced may be proportional to the increase in radius at which the stator segment is disposed, assuming equivalent flux in the gap and current density limits in the stator. However, the cost of maintaining equivalent flux in the gap for an "off center" stator segment is an increase in magnet volume inversely proportional to the angle subtended by that segment. This is not a desirable tradeoff in most cases. However, in an application where peak torque is desired at a particular angle or range of shaft angles, the magnet material may be distributed non-uniformly with respect to the rotor, so that the stator is exposed to peak magnetic flux density at the shaft angles where peak torque is desired. For generator applications where the source has periodic torque production capacity, a machine designed according to this principle may offer similar advantages.

The design of the stator and magnet system to produce peak torque at specific angles is not limited to one stator segment and/or one concentration of magnetic material on the rotor, although this is the simplest embodiment. Embodiments including one or more non-uniformly distributed stator segments and/or one or more non-uniformly distributed magnet segments may provide useful combinations of torque capability as a function of angle. It should be appreciated that the same or similar torque capability as a function of angle can be achieved using different combinations of one or more non-uniformly distributed stator segments and one or more non-uniformly distributed magnet segments. For example, the same or similar torque capability as a function of angle can be achieved by interchanging the distribution of stator segments versus rotor magnet locations. This may allow designers to effect tradeoffs in the cost of magnet material and stator area while achieving the same or similar torque capability as a function of angle.

The design of a machine to produce peak torque at a particular angle does not preclude continuous rotation. When continuous rotation is desired, a machine designed according to the principles disclosed here can supply torque in a series of pulses (at the peak torque angles) that are smoothed by the moment of inertia of the attached load to provide approximately constant speed. An advantage of this design is that the losses in the stator due to eddy currents may be zero when the stator does not overlap the magnets. Another possibility for continuous rotation is to distribute magnets so that the stator segment always sees magnet flux, but at smaller magnitude than the "peak torque" angles.

Some embodiments described herein may be particularly advantageous for applications where the machine radius can be significantly increased, relative to a conventional design. In these applications, a planar circuit board stator (PCS) segment disposed at a larger radius than a uniform planar circuit board stator may achieve higher peak torque per unit area of stator. Further, in comparison to a thin annular stator at a large radius, stator segments can be "tiled" or arranged on a printed circuit board "panel" of standard size. This may allow a more efficient utilization of printed circuit board material and reduce the cost of the associated machine.

Examples of application areas include reciprocating piston or diaphragm type pumps, which may have a periodic torque requirement. Also, for purposes of balance, these machines frequently include an off-center mass that can potentially be replaced by an asymmetrically designed rotor. Similarly, generators coupled to single piston engines may benefit from co-design of balancing masses with the magnetic materials in a stator-segment type generator. Other potential applications include washing machines or other applications where the motor or generator moves through a limited angle, and periodic or "reversing" type loads.

A basic observation of the novel concepts disclosed herein can be reduced to a "scaling" argument for otherwise equivalent stators or stator segments, independent of the internal organization and connection of the stator, based on fundamental considerations of the design. In a conventional annular PCS, conforming to the description in the '625 patent, the torque can be expressed as follows $$\tau = \int_{r1}^{r2} \int_{0}^{2\pi} r \, dr \, d\theta \, rf_{dens}(r).$$

The components of this expression include integration from a first radius r1 to a second radius r2, comprising the active area of the stator. The integral covers a complete annulus by the limits of integration on θ. The term r dr dθ is a differential area element, and $rf_{dens}$ is the torque density magnitude corresponding to the equation $\tau = r \times F$. The force density is θ-directed due to the axial flux and radial current density, i.e., $$f_{dens} = J(r) \times B$$

Here, the force density is the product of the current density supported by the stator, and magnetic flux density resulting from the rotor magnet circuit and stator reaction at that current density. For illustration, B is assumed to be radial. In stators designed according to the '625 patent, diverging radial traces effectively introduce a 1/r decrease in current density from the inner radius r1. A model capturing this effect is $$J(r) = J_0 r_1 / r$$

where $J_0$ is the maximum supported current density based on the interference of features at a given copper weight, via size and clearance requirements at the inner radius. With this model, $$\tau_{peak} = J_0 B A r_1$$

the current density supported by the stator depends on the number of inner vias that can be disposed at r1, which is dependent on feature sizes and associated clearances, as well as the circumference at r1, and whether that circumference accommodates features at a spacing that approaches the fabrication limits. Thus, it is not strictly correct to regard $J_0$ as constant. For r1=0, for example, no vias can be accommodated, and $J_0$=0. However, for motors of practical interest, $J_0$ will approach a value dependent primarily on thermal considerations and clearance requirements. Taking $J_0$ as a constant for purposes of comparison between otherwise equivalent stators tends to make a conventional stator located around the central shaft, with a smaller r1, appear more competitive than a stator segment at a larger radius.

The area A of the stator or stator segment with angular extent δ is $$A = \frac{\delta}{2\pi}\pi(r_2^2 - r_1^2)$$

For a stator of conventional design, δ=2η. For a stator segment, δ ideally corresponds to a whole number of pole pairs. For purposes of comparison between stator segments and conventional designs on the basis of cost, it is reasonable to compare equal-area stators and magnet assemblies. Multiple solutions of δ and $r_2$ exist for any $r_1$ as the inner radius $r_1$ is increased, and considered here as the independent variable. In particular, when considering δ, the pole spacing over a segment need not also conform to the usual constraint of disposing poles uniformly over 2π rad, as in a conventional stator. This suggests considerable design flexibility for the segment that is not enjoyed by the conventional stator, as well as the ability to achieve equal area A. Examples of advantages of displacing stator area to larger $r_1$ with compact δ, include: (1) stator segments with larger $r_1$ offer higher peak torque per unit area, (2) when stator segments and magnetic material overlap fully at specific rotor angles (or angle ranges), peak torque is available, (3) there is no eddy current loss in the machine when the magnetic material and stator do not overlap, (4) stator segments can be obtained where $r_1$, $r_2$, and δ are such that the segments can "nest" on a printed circuit board panel, minimizing wasted material and cost, and (5) peak torque per unit area (or per unit cost) increases with the radius of stator segment.

Given a design procedure for a prototype conventional stator with δ=2π meeting a specific torque $\tau_p$, designs for stator segments subtending a subset of the poles in the prototype design spanning an angle δ can be inferred to produce a peak torque of $$\frac{\delta}{2\pi}\tau_p$$

over the range of angles where the segment fully overlaps the magnetic material. Thus, a practical design procedure for segments is to design conventional stator prototypes, where the torque requirement is increased by the ratio of the poles in the conventional stator relative to the poles intended to be preserved in the segment. This procedure, while expedient, does not exploit the freedom in the segmented design, because the pole spacing is simultaneously constrained to the angular extent of the segment, and to the 2π extent of the conventional design. The segment angle δ does not need to be a divisor of 2π and can thus be optimized to meet the design constraints.

Combinations of stator segments and magnetic material, concentrated at particular angles on the fixed frame and rotor, can achieve various torque capabilities as a function of angle. One or more areas on the rotor may carry magnetic materials comprising different flux densities, one or more pole pairs, and may be distributed at various angles. There may be one or more stator segments, in the fixed frame, positioned at various angles.

Examples of motor and/or generator designs in which non-uniformly distributed stators and/or rotors, such as those disclosed herein, may be employed are described in U.S. Pat. Nos. 7,109,625; 9,673,688; 9,800,109; 9,673,684; and 10,170,953, as well as U.S. Patent Application Publication No. 2018-0351441 A1 ("the '441 Publication"), which are incorporated by reference above. Illustrative examples of such machines will initially be described in connection with FIGS. 1A and 1B. Examples of stators and rotors having magnetic flux profiles that are non-uniformly distributed about a rotor's axis of rotation, and which may be employed in such machines, will then be described in connection with FIGS. 2-8.

Figure 1A:
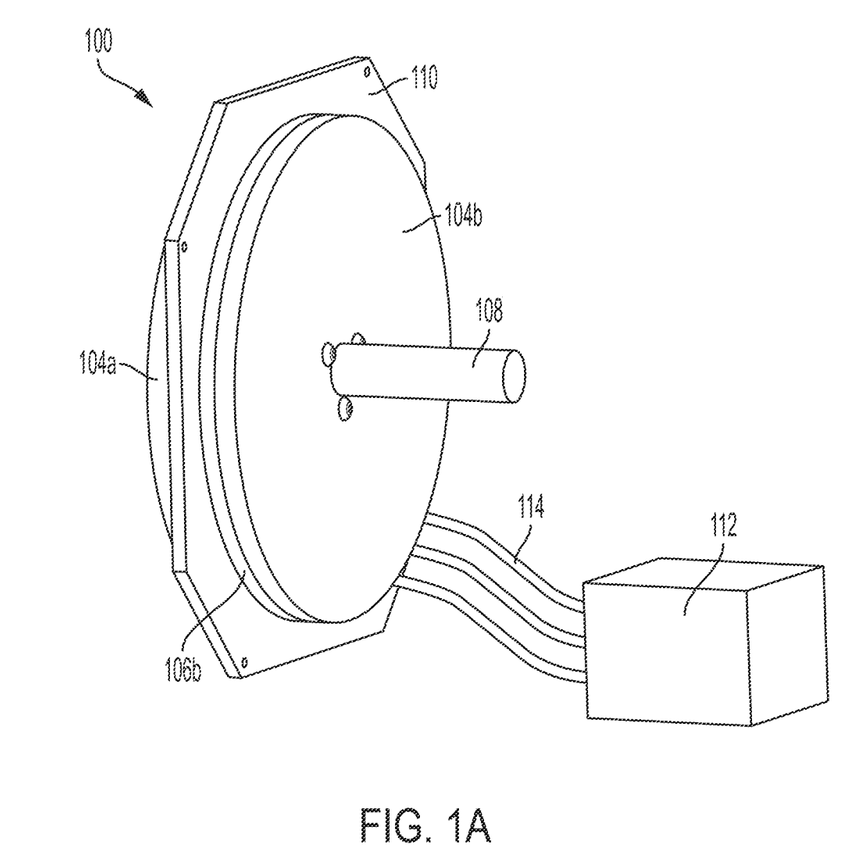
FIG. 1A shows an example of an axial flux motor or generator with which some aspects of this disclosure may be employed.
Figure 1B:
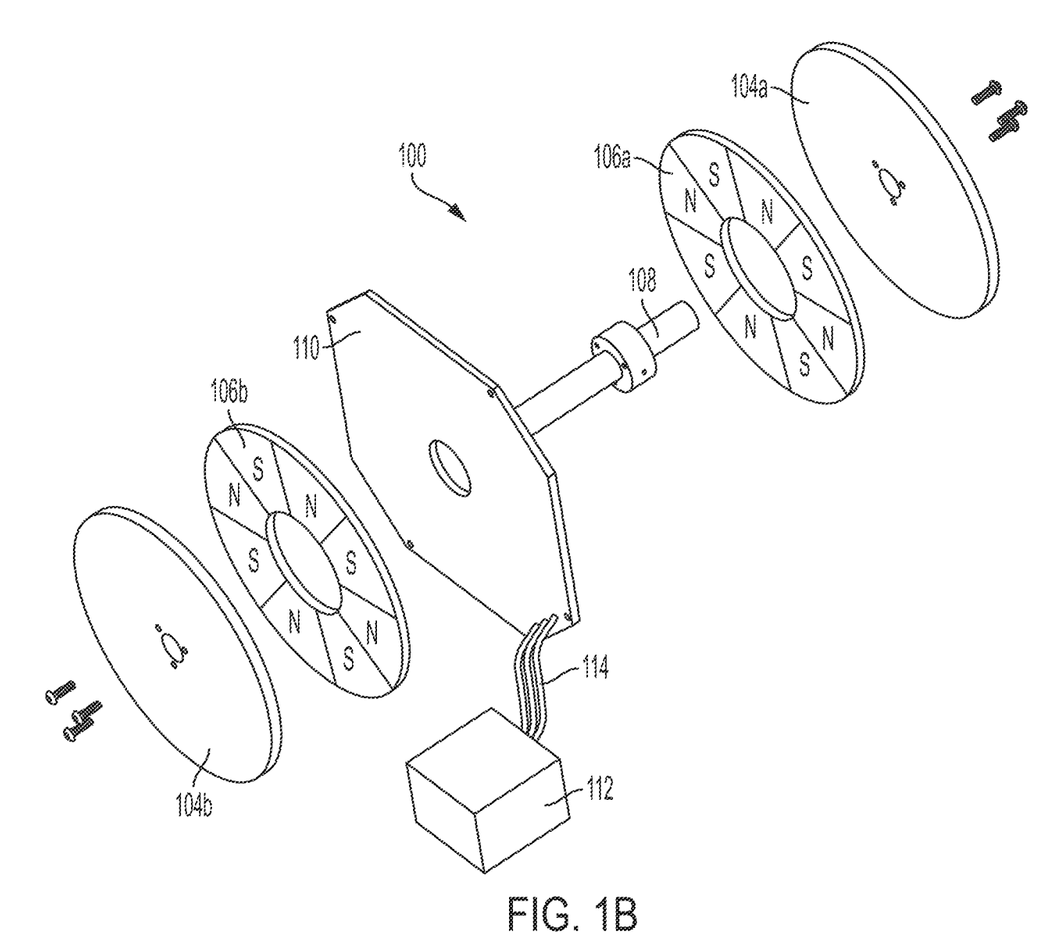
FIG. 1B is an expanded view showing the components of the axial flux motor or generator shown in FIG. 1A and a means for assembling such components.

FIG. 1A shows an example of a system 100 employing a planar composite stator 110 in an assembly with rotor components 104a and 104b, shaft 108, wires 114, and controller 112. An expanded view showing these components and a means for their assembly is shown in FIG. 1B. The pattern of magnetic poles in the permanently magnetized portions 106a, 106b of the rotor assembly is also evident in the expanded view of FIG. 1B. FIG. 1A is an example of an embodiment where the electrical connections 114 are taken at the outer radius of the PCS 110, and the stator is mounted to a frame or case at the outer periphery. Another useful configuration, the "out-runner" configuration, involves mounting the stator at the inner radius, making electrical connections 114 at the inner radius, and replacing the shaft 108 with an annular ring separating the rotor halves. It is also possible to configure the system with just one magnet, either 106a or 106b, or to interpose multiple stators between successive magnet assemblies. Wires 114 may also convey information about the position of the rotor based on the readings of Hall-effect or similar sensors mounted on the stator. Not shown, but similar in purpose, an encoder attached to the shaft 108 may provide position information to the controller 112.

The system 100 in FIGS. 1A and 1B can function either as a motor, or a generator, depending on the operation of the controller 112 and components connected to the shaft 108. As a motor system, the controller 112 operates switches so that the currents in the stator 110 create a torque about the shaft, due to the magnetic flux in the gap originating from the magnets 104a, 104b connected to the shaft 108. Depending on the design of the controller 112, the magnetic flux in the gap and/or the position of the rotor may be measured or estimated to operate the switches to achieve torque output at the shaft 108. As a generator system, a source of mechanical rotational power connected to the shaft 108 creates voltage waveforms at the terminals 112 of the stator. These voltages can either be directly applied to a load, or they can be rectified with a three-phase (or poly phase) rectifier within the controller 112. The rectifier implementation 112 can be "self-commutated" using diodes in generator mode, or can be constructed using the controlled switches of the motor controller, but operated such that the shaft torque opposes the torque provided by the mechanical source, and mechanical energy is converted to electrical energy. Thus, an identical configuration in FIG. 1A may function as both a generator and motor, depending on how the controller 112 is operated. Additionally, the controller 112 may include filter components that mitigate switching effects, reduce EMI/RFI from the wires 114, reduce losses, and provide additional flexibility in the power supplied to or delivered from the controller.

Figure 2:
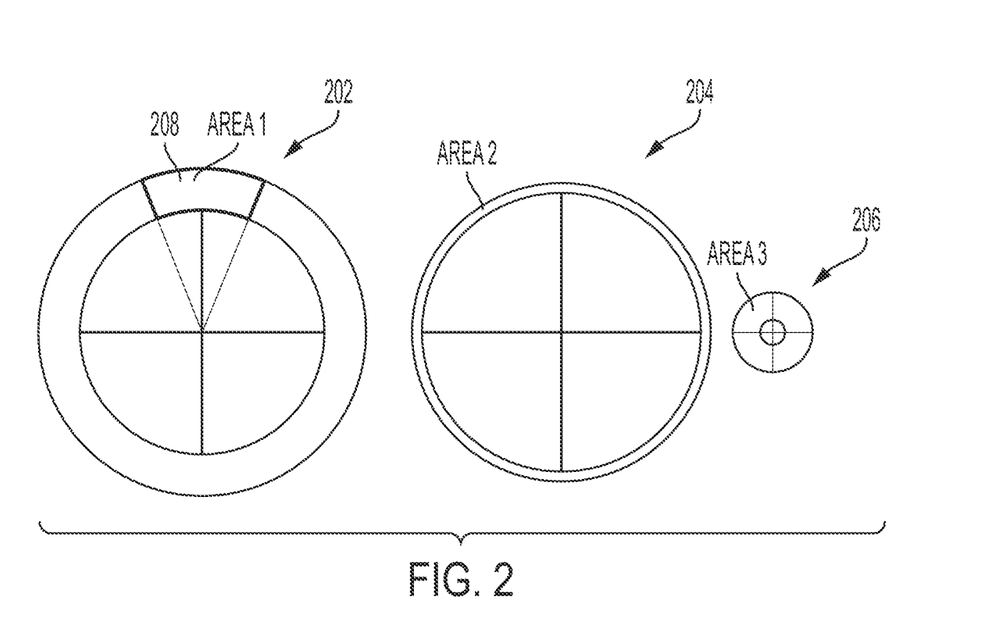
FIG. 2 is a conceptual diagram showing three printed circuit board stators having equal areas but different configurations.

FIG. 2 shows geometries of three stators 202, 204, 206 with different angular and radial extent, but of equal area. Stators 204 and 206 differ by the inner radius. Stator 206 shows relative dimensions typical of stators as described by the '625 patent. Stator 204 is a thin annular design. In stator 204, the inner radius is increased, but a stator with these relative dimensions does not make efficient use of a "panel" of printed circuit board material. Stator 202 shows a stator segment 208, as proposed herein, of equal area and equivalent radius to stator 204. All else equal, at the larger radii, stators 202 and 204 would produce a higher peak torque than stator 206 as the radius increases the torque arm.

Figure 3:
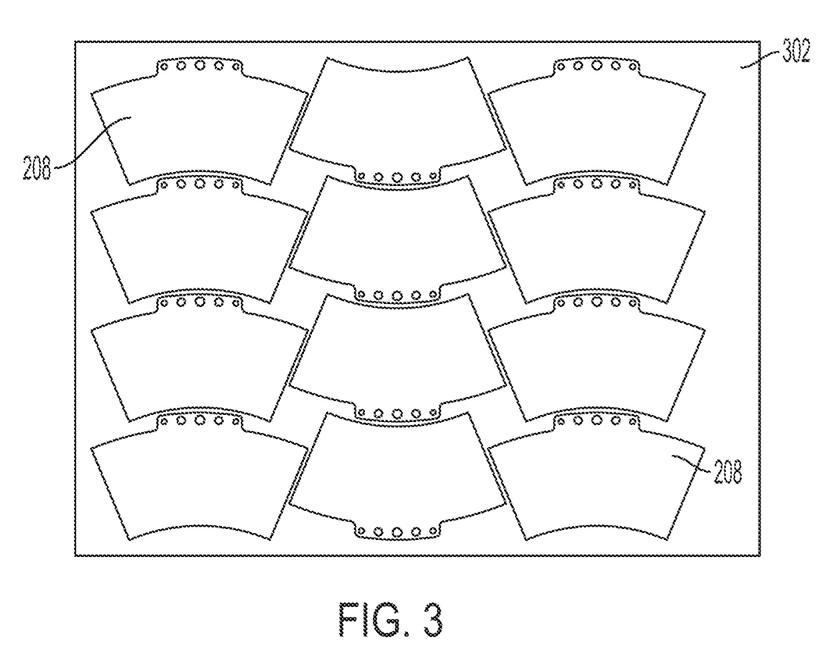
FIG. 3 is a diagram showing how multiple stator segments may be arranged for manufacture on a printed circuit board panel of standard dimensions.

FIG. 3 shows the "panelization," or packing, of stator segments like the segment 208 shown in FIG. 2, on a standard sized printed circuit board panel 302. The effective utilization of the panel 302 is high with the illustrated arrangement. Cost of the stator segments 208 is inversely proportional to the utilization of the panel 302.

Figure 4:
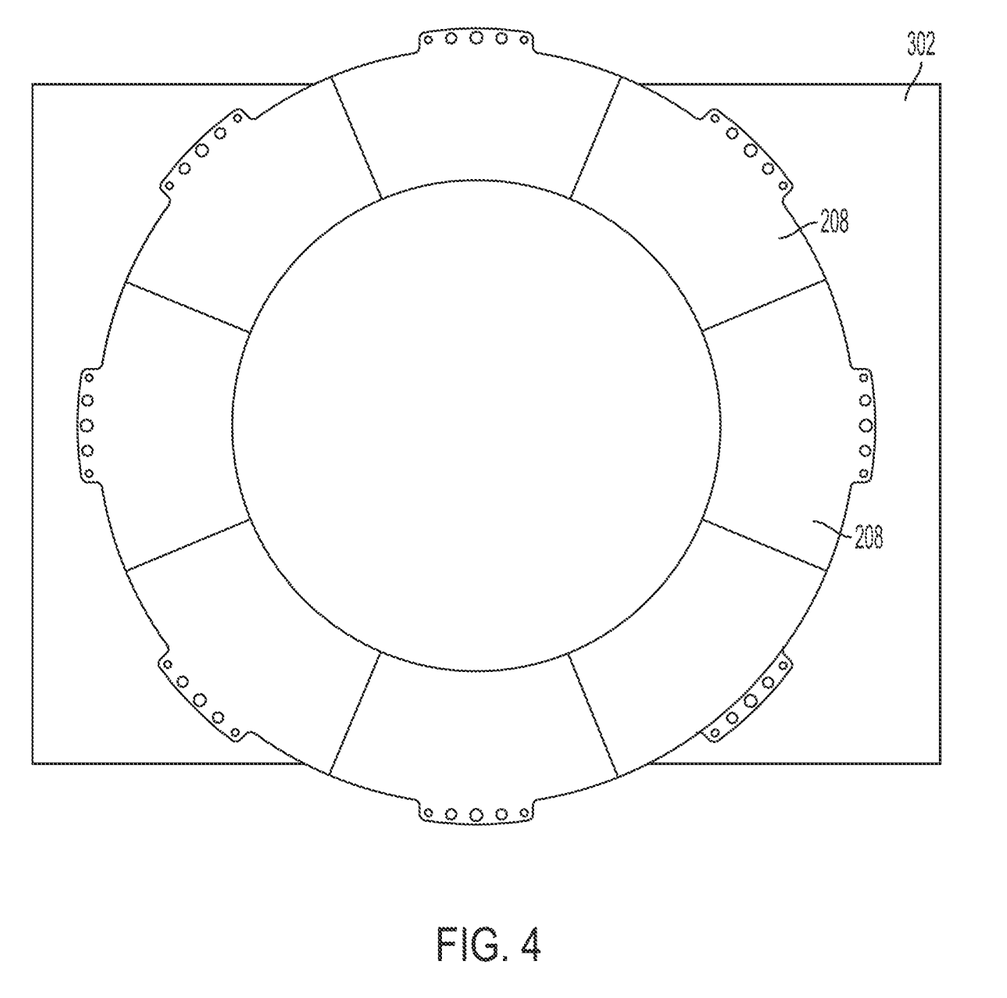
FIG. 4 is a diagram showing how a subset of the stator segments shown in FIG. 3 would appear if they were arranged edge to edge on the circuit board panel shown in FIG. 3.

FIG. 4 shows an ineffective arrangement of segments 208 of the same size as in FIG. 3 on the panel 302. While this arrangement is not practical, it shows the effective panel utilization that would be achieved for a conventional stator with the same inner and outer radii as achieved by the segments 208.

Figure 5:
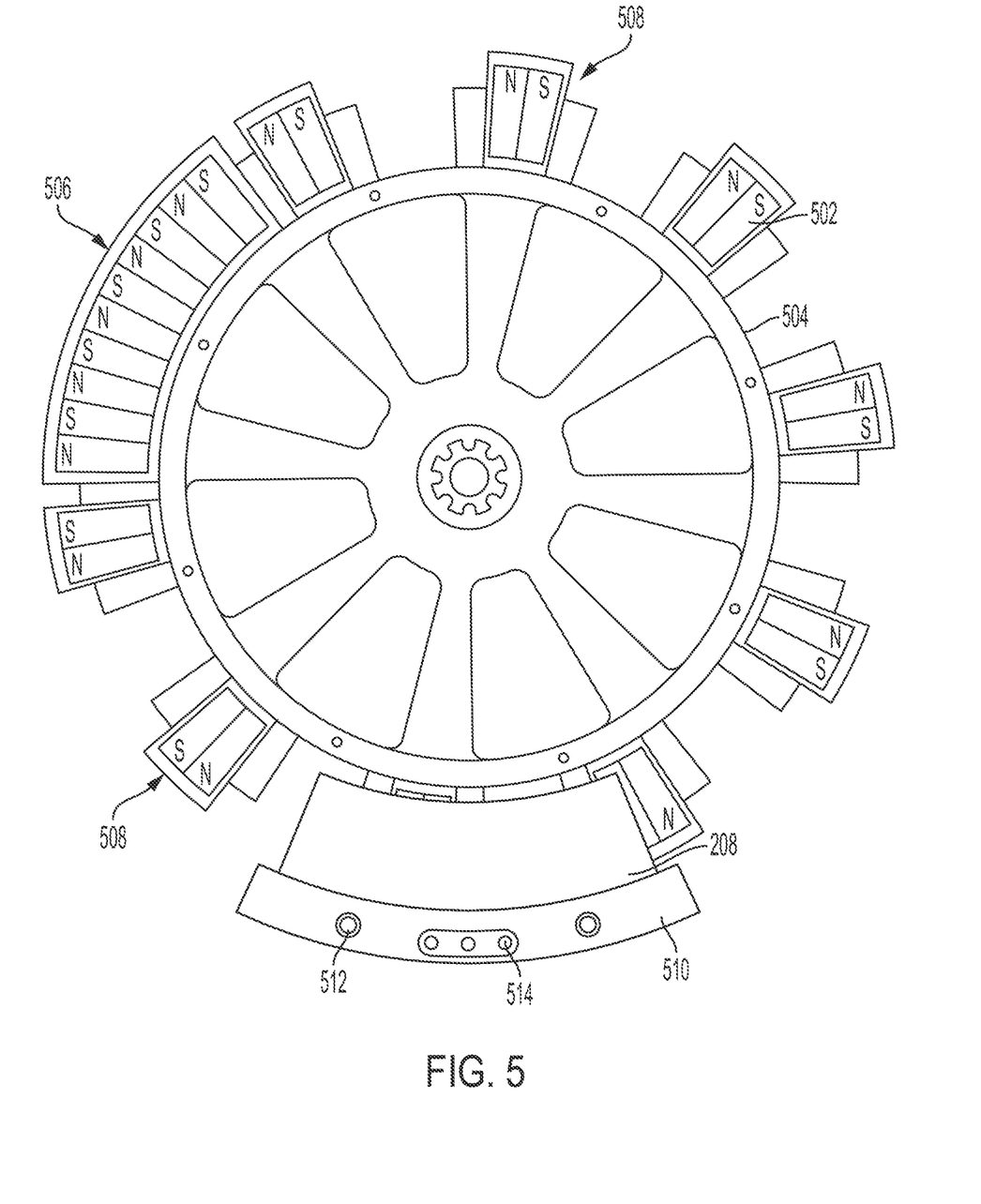
FIG. 5 shows an example arrangement of a stator segment with respect to magnets on a rotor in accordance with some aspects of the present disclosure.

FIG. 5 shows an example arrangement of a stator segment 208 with respect to magnets 502 on a rotor 504. In the illustrated example, a dense angular extent 506 of the magnets 502, also referred to herein as a "dense magnet area," on the rotor 504 is provided to achieve peak torque at the angle of overlap with the stator segment 208. Less dense angular extents 508 of the magnets 502, also referred to herein as "less dense magnet areas," are arranged to provide a lower torque capability independent of angle. Although not illustrated, it should be appreciated that, in some embodiments, non-magnetic elements may be added in the vicinity or the less dense magnet areas 508 to balance the weight of the rotor 504 as a whole. Further, it should be appreciated that, in some embodiments, an additional rotor portion (not shown) having a corresponding, though opposite polarity, magnet arrangement may be positioned above the illustrated portion of the rotor 504 such that the stator segment 208 may be positioned within a gap between the two rotor portions, with lines of magnetic flux extending in a direction parallel to the axis of rotation of the rotor between pairs of opposing, opposite polarity magnets. In addition, although not illustrated in FIG. 5, it should be appreciated that the stator segment 208 may include conductive traces and/or vias, e.g., disposed on one or more dielectric layers, that are configured to form windings that, when energized with current, generate magnetic flux in a direction parallel to the axis of rotation of the rotor. Such windings may be configured to receive one or more phases of current from a power supply (not shown in FIG. 5), and may be arranged in one or more spirals, one or more serpentine patterns, or otherwise, so as to generate such magnetic flux.

As shown in FIG. 5, in some embodiments, the stator segment 208 may be held in place via an arcuate attachment member 510 to which the stator segment 208 may be attached using one or more fasteners 512, and the one or more windings (not illustrated) of the stator segment 208 may be connected to terminals 514 associated with the attachment member 510, which terminals may be connected to a controller (not shown in FIG. 5), such as the controller 112 discussed above in connection with FIGS. 1A and 1B, so as to supply energizing current(s) to the winding(s).

Figure 6:
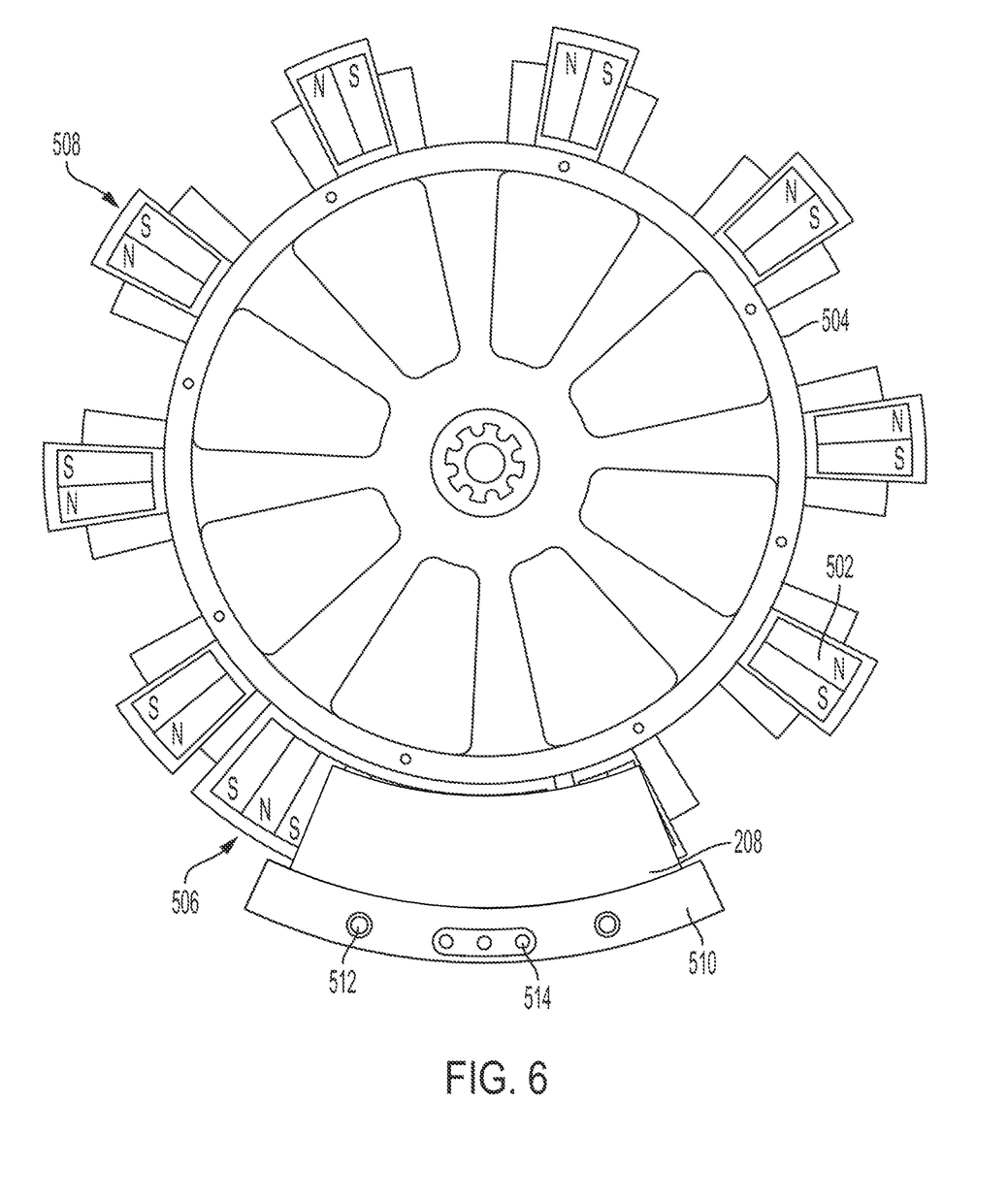
FIG. 6 shows the same arrangement as FIG. 5, but where the rotor is shown at an angle where the stator segment overlaps with a magnet section that provides peak torque.

FIG. 6 shows the same configuration as FIG. 5, but with the rotor 504 positioned at an angle where the stator segment 208 overlaps with the dense magnet section 506 that provides peak torque.

Figure 7:
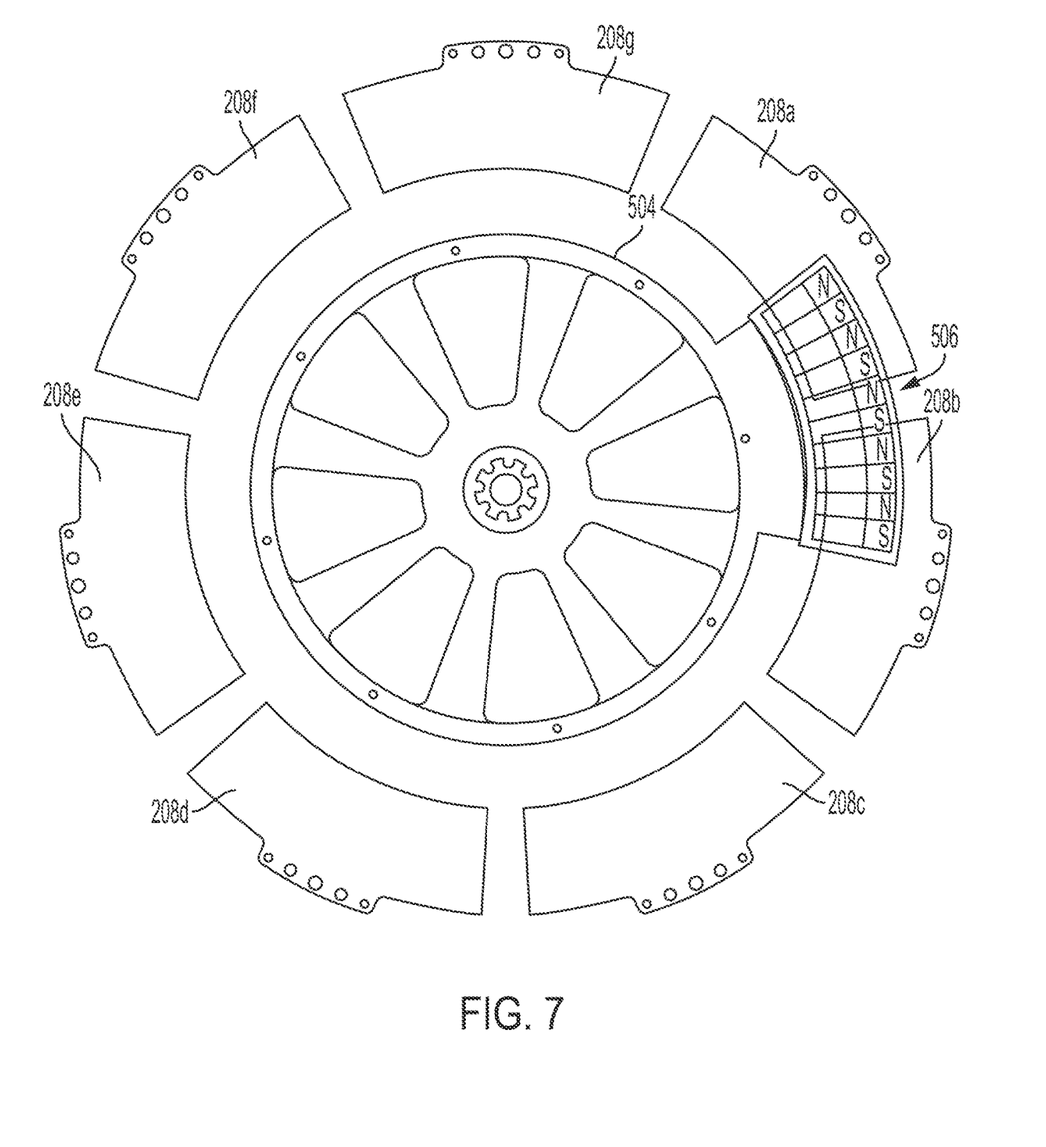
FIG. 7 shows an example arrangement of multiple stator segments with respect to magnets on a rotor in accordance with some aspects of the present disclosure.

FIG. 7 shows an alternate arrangement to FIGS. 4 and 5. As shown, in addition to or in lieu of employing less dense magnet regions 508 (not shown in FIG. 7) together with a dense angular extent 506, stator segments 208a-g may be arranged so that they fully or nearly describe an annular stator with constant available torque at any angle. In some embodiments, a subset of the stator segments 208a-g may be made smaller, may be arranged with a coarser pitch, may contain fewer winding "turns," and/or may be supplied with less power than one or more other stator segments 208, so that a machine with concentrated magnets can offer angle-specific peak torque, while still providing torque capability at any angle. For example, in some embodiments, the stator segment 208a may be configured, arranged and/or energized differently than the other stator segments 208b-g for such a purpose.

No matter the particular arrangement of magnet(s) 502 and stator segment(s) 208 that is employed, in at least some circumstances, care may be taken to ensure that at least one stator segment 208 at least partially overlaps at least one magnet 502 at each position during a revolution of the rotor 504, so that the rotor 504 does not become "stuck" at a position where no magnetic flux from a stator segment 208 interacts with magnetic flux from a magnet 502.

In each of the above-described example configurations, the stator segment(s) 208 and/or the magnet(s) 502 of the rotor 504 are configured to have a magnetic flux profile that is non-uniformly distributed about the machine's principle axis of rotation. In particular, the stator segment(s) 208 are arranged such that, at any given point in time when the windings of the stator are energized with current, the locations of peak magnetic flux generated by the stator are non-uniformly distributed with respect to angle about the rotor's axis of rotation. Similarly, in such machines, the magnets 502 of a rotor 504 are also arranged such that, at any given point in time, the locations of peak magnetic flux generated by the rotor are likewise non-uniformly distributed with respect to angle about the rotor's axis of rotation. Accordingly, for each of the rotor and the stator in such machines, different angles separate at least some locations of peak magnetic flux from adjacent locations of peak magnetic flux about the axis of rotation so that that magnetic flux profile generated by such component is non-uniformly distributed about the axis of rotation.

Figure 8:
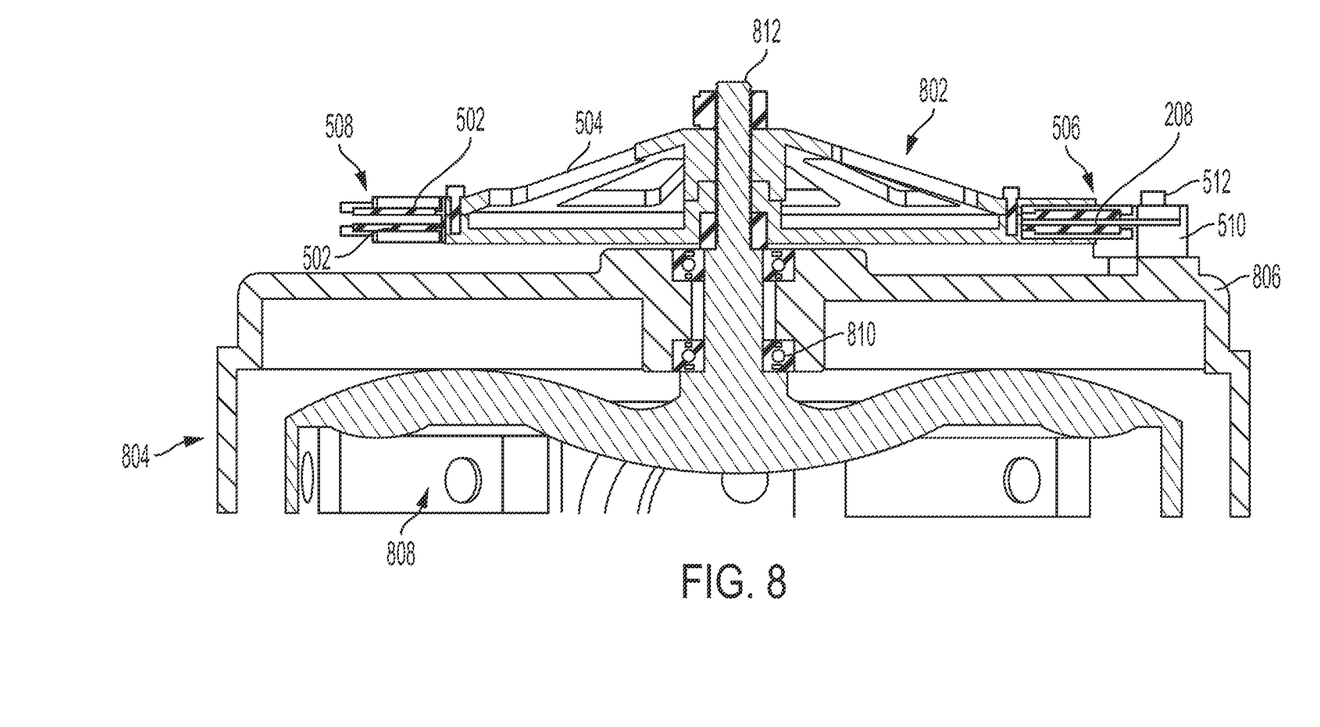
FIG. 8 illustrates a cross section of an example embodiment of an axial flux motor that is configured and integrated with a washing machine load in accordance with some aspects of the present disclosure.

FIG. 8 illustrates a cross section of an example embodiment of an axial flux motor 802 that is configured with components like those shown in FIGS. 5 and 6 and that is integrated with a washing machine load 804 in accordance with some aspects of the present disclosure. As shown, a stator segment 208 of the motor 802 may be secured to a housing 806 containing a washing machine tub 808 via an attachment member 510 and one or more fasteners 512, and the washing machine tub 808 may be rotatably couple to the housing 806 via bearing elements 810. A rotor 504 of the motor 802 may directly drive the washing machine tub 808 via a shaft 812 that may extend from and/or be fixedly attached to the washing machine tub 808. With the illustrated configuration, continuous rotation at relatively high speed and low torque in "spin" mode may be achieved using the stator segment 208 and a collection of magnets 502 arranged into a dense magnet region 506 and one or more less dense magnet regions 508, as described above in connection with FIGS. 5 and 6. During such a spin mode, due to the non-uniform distribution of the magnetic flux profiles of the rotor and the stator about the rotor's axis of rotation, as the rotor 504 rotates through a range of angles with respect to the stator segment 208 at a substantially constant speed, the periodicity of the torque produced due to interaction between the magnetic flux generated by the rotor and the stator is irregular. The reversing action needed for "wash" mode may be a relatively low speed, high-torque mode of operation where torque can be supplied at specific angles. In this case, the interaction of the stator segment 208 with the dense magnet region 506 may provide the peak torque requirement.

Examples Implementations of Apparatuses and Methods in Accordance with the Present Disclosure The following paragraphs (A1) through (A14) describe examples of apparatuses that may be implemented in accordance with the present disclosure.

(A1) A motor or generator may comprise a rotor having an axis of rotation and configured to generate first magnetic flux parallel to the axis of rotation, and a stator configured to generate second magnetic flux parallel to the axis of rotation, wherein at least one of the rotor or the stator is configured to generate a magnetic flux profile that is non-uniformly distributed about the axis of rotation.

(A2) A motor or generator may be configured as described in paragraph (A1), and the rotor may be further configured to generate a first magnetic flux profile that is non-uniformly distributed about the axis of rotation.

(A3) A motor or generator may be configured as described in paragraph (A2), and the rotor may further comprise one or more magnet segments non-uniformly distributed about the axis of rotation.

(A4) A motor or generator may be configured as described in paragraph (A3), and each of the one or more magnet segments may further have a respective surface location at which the first magnetic flux has a maximum density, and the respective surface locations may be non-uniformly distributed about the axis of rotation.

(A5) A motor or generator may be configured as described in any of paragraphs (A2) through (A4), and the rotor may be further configured such that, as the rotor rotates through a range of angles with respect to the stator at a substantially constant speed, a periodicity of torque produced due to interaction of the first magnetic flux and the second magnetic flux is irregular.

(A6) A motor or generator may be configured as described in any of paragraphs (A2) through (A5), and the stator may be further configured to generate a second magnetic flux profile that is non-uniformly distributed about the axis of rotation.

(A7) A motor or generator may be configured as described in paragraph (A1), and the stator may be further configured to generate a magnetic flux profile that is non-uniformly distributed about the axis of rotation.

(A8) A motor or generator may be configured as described in any of paragraphs (A2) through (A7), and the stator may further comprise one or more printed circuit board segments non-uniformly distributed about the axis of rotation.

(A9) A motor or generator may be configured as described in any of paragraphs (A2) through (A8), and the stator may further comprises conductive traces arranged on at least one dielectric layer to generate the second magnetic flux when energized with current.

(A10) A motor or generator may be configured as described in any of paragraphs (A2) through (A9), and the stator may be further configured such that, at any given time when the conductive traces are energized with current, one or more locations of maximum density of the second magnetic flux are non-uniformly distributed about the axis of rotation.

(A11) A motor or generator may be configured as described in paragraph (A9) or paragraph (A10), the conductive traces are arranged on the at least one dielectric layer and coupled to a power source to generate three phases of the second magnetic flux corresponding to three phases of current output by the power source.

(A12) A motor or generator may be configured as described in any of paragraphs (A1) through (A11), and the stator may be further configured such that, as the rotor rotates through a range of angles with respect to the stator at a constant speed, a periodicity of torque produced due to interaction of the first magnetic flux and the second magnetic flux is irregular.

(A13) A rotor for use in a motor or generator may comprise a support structure, and one or more magnet segments that are supported by the support structure and that generate first magnetic flux parallel to an axis of rotation about which the support structure rotates when assembled with a stator that generates second magnetic flux parallel to the axis of rotation, wherein the one or more magnet segments are configured and arranged to generate a magnetic flux profile that is non-uniformly distributed about the axis of rotation.

(A14) A rotor may be configured as described in paragraph A13, and the one or more magnet segments may further include at least a first magnet segment and a second magnet segment spaced apart from the first magnet segment, and the first magnet segment may include a larger number of adjacent magnets than the second magnet segment.

The following paragraphs (M1) through (M5) describe examples of methods that may be implemented in accordance with the present disclosure.

(M1) A method may comprise arranging one or more magnetic flux producing windings of a stator non-uniformly about an axis of rotation of a rotor of an axial flux motor or generator.

(M2) A method may be performed as described in paragraph (M1), wherein arranging the one or more magnetic flux producing windings further comprises arranging one or more printed circuit board segments including the windings non-uniformly about the axis of rotation.

(M3) A method may be performed as described in paragraph (M1) or paragraph (M2), wherein arranging the one or more printed circuit board segments may further comprise arranging the one or more printed circuit board segments such that, at any given time when the windings are energized with current, one or more locations of maximum density of the second magnetic flux are non-uniformly distributed about the axis of rotation.

(M4) A method may be performed as described in any of paragraphs (M1) through (M3), wherein the rotor may comprise magnets arranged non-uniformly about the axis of rotation.

(M5) A method may be performed as described in any of paragraphs (M1) through (M4), wherein arranging the one or more magnetic flux producing windings may further comprise arranging the one or more magnetic flux producing windings such that, as the rotor rotates through a range of angles with respect to the stator at a constant speed, a periodicity of torque produced due to interaction of magnetic flux generated by the rotor and the stator is irregular.

Having thus described several aspects of at least one embodiment, it is to be appreciated that various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

Various aspects of the present disclosure may be used alone, in combination, or in a variety of arrangements not specifically discussed in the embodiments described in the foregoing and is therefore not limited in this application to the details and arrangement of components set forth in the foregoing description or illustrated in the drawings. For example, aspects described in one embodiment may be combined in any manner with aspects described in other embodiments.

Also, the disclosed aspects may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence or order of one claim element over another or the temporal order in which acts of a method are performed, but are used merely as labels to distinguish one claimed element having a certain name from another element having a same name (but for use of the ordinal term) to distinguish the claim elements.

Also, the phraseology and terminology used herein is used for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A method, comprising:
   arranging one or more magnets of a rotor of an axial flux motor or generator non-uniformly about an axis of rotation of the rotor; and
   arranging one or more magnetic flux producing windings of a stator of the axial flux motor or generator non-uniformly about the axis of rotation.

2. The method of claim 1, wherein arranging the one or more magnetic flux producing windings comprises:
   arranging one or more printed circuit board segments including the windings non-uniformly about the axis of rotation.

3. The method of claim 2, wherein arranging the one or more printed circuit board segments further comprises:
   positioning the one or more printed circuit board segments such that, at any given time when the windings are energized with current, one or more locations of maximum density of magnetic flux generated by the magnetic flux producing windings are non-uniformly distributed about the axis of rotation.

4. The method of claim 1, wherein arranging the one or more magnetic flux producing windings comprises:
   positioning the one or more magnetic flux producing windings such that, as the rotor rotates through a range of angles with respect to the stator at a constant speed, a periodicity of torque produced due to interaction of magnetic flux generated by the rotor and the stator is irregular.

5. The method of claim 1, further comprising:
   positioning the one or more magnets and the one or more magnetic flux producing windings such that a torque capability provided between the rotor and the stator varies aperiodically as a function of an angular position of the rotor relative to the stator as the rotor rotates through a full mechanical rotation about the axis of rotation.

6. The method of claim 1, wherein arranging the one or more magnets comprises:
   orienting at least first, second, and third magnets to generate magnetic flux in a first direction parallel to the axis of rotation;
   positioning the first and second magnets such that no other magnets that are oriented to generate magnetic flux in the first direction are positioned angularly between the first magnet and the second magnet;
   positioning the second and third magnets such that no other magnets that are oriented to generate magnetic flux in the first direction are positioned angularly between the second magnet and the third magnet; and
   positioning the first, second and third magnets such that a first angular distance between the first magnet and the second magnet is at least two times a second angular distance between the second magnet and the third magnet.

7. The method of claim 6, wherein arranging the one or more magnetic flux producing windings comprises:
   orienting at least first, second, and third magnetic flux producing windings to generate magnetic flux in a second direction parallel to the axis of rotation;
   positioning the first and second magnetic flux producing windings such that no other magnetic flux producing windings that are oriented to generate magnetic flux in the second direction are positioned angularly between the first magnetic flux producing winding and the second magnetic flux producing winding;
   positioning the second and third magnetic flux producing windings such that no other magnetic flux producing windings that are oriented to generate magnetic flux in the second direction are positioned angularly between the second magnetic flux producing winding and the third magnetic flux producing winding; and
   positioning the first, second and third magnetic flux producing windings such that a third angular distance between the first magnetic flux producing winding and the second magnetic flux producing winding is at least two times a fourth angular distance between the second magnetic flux producing winding and the third magnetic flux producing winding.

8. The method of claim 1, wherein:
   arranging the one or more magnets comprises positioning a first magnet to generate a first peak magnetic flux density, parallel to the axis of rotation, at a first location relative to the rotor, and positioning a second magnet to generate a second peak magnetic flux density, parallel to the axis of rotation, at a second location relative to the rotor; and
   arranging the one or more magnetic flux producing windings comprises positioning a first magnetic flux producing winding to generate a third peak magnetic flux density, parallel to the axis of rotation, at a third location relative to the stator;
   wherein the one or more magnets and the one or more magnetic flux producing windings are arranged such that a first torque capability between the rotor and the stator when the first location is angularly aligned with the third location is greater than a second torque capability between the rotor and the stator when the second location is angularly aligned with the third location.

9. The method of claim 8, wherein the one or more magnets and the one or more magnetic flux producing windings are arranged such that the first torque capability when the first location is angularly aligned with the third location is at least twenty five percent greater than the second torque capability when the second location is angularly aligned with the third location.

10. The method of claim 8, wherein the one or more magnets and the one or more magnetic flux producing windings are arranged such that the first torque capability when the first location is angularly aligned with the third location is at least two times the second torque capability when the second location is angularly aligned with the third location.

11. The method of claim 1, wherein:
   arranging the one or more magnetic flux producing windings comprises positioning a first magnetic flux producing winding to generate a first peak magnetic flux density, parallel to the axis of rotation, at a first location relative to the stator, and positioning a second magnetic flux producing winding to generate a second peak magnetic flux density, parallel to the axis of rotation, at a second location relative to the stator;
   arranging the one or more magnets comprises positioning a first magnet to generate a third peak magnetic flux density, parallel to the axis of rotation, at a third location relative to the rotor; and
   the rotor and the stator are configured such that a first torque capability between the rotor and the stator when the first location is angularly aligned with the third location is greater than a second torque capability between the rotor and the stator when the second location is angularly aligned with the third location.

12. The method of claim 11, wherein the one or more magnets and the one or more magnetic flux producing windings are arranged such that the first torque capability when the first location is angularly aligned with the third location is at least twenty five percent greater than the second torque capability when the second location is angularly aligned with the third location.

13. The method of claim 11, wherein the one or more magnets and the one or more magnetic flux producing windings are arranged such that the first torque capability when the first location is angularly aligned with the third location is at least two times the second torque capability when the second location is angularly aligned with the third location.

14. The method of claim 1, wherein arranging the one or more magnets comprises positioning the one or more magnets such that a first angular half of the rotor generates a first amount of magnetic flux in a first direction parallel to the axis of rotation and a second angular half of the rotor generates a second amount of magnetic flux in the first direction that is substantially greater than the first amount.

15. The method of claim 1, wherein arranging the one or more magnets comprises positioning the one or more magnets to have 1-fold angular symmetry with respect to the rotor.

16. The method of claim 1, wherein arranging the one or more magnets comprises:
   orienting one or more first magnets to generate a peak magnetic flux density in a first direction parallel to the axis of rotation;
   positioning a first quantity of the one or more first magnets at one or more first angular locations on a first angular half of the rotor; and
   positioning a second quantity of the one or more first magnets at zero or more second angular locations on a second angular half of the rotor, wherein the second quantity is greater than the first quantity.

17. The method of claim 1, wherein arranging the one or magnetic flux producing windings comprises:
   orienting one or more first magnetic flux producing windings to generate a peak magnetic flux density in a first direction parallel to the axis of rotation;
   positioning a third quantity of the one or more magnetic flux producing windings at one or more third angular locations on a first angular half of the stator; and
   positioning a fourth quantity of the one or more magnetic flux producing windings at zero or more fourth angular locations on a second angular half of the stator, wherein the third quantity is greater than the fourth quantity.

\* \* \* \* \*